(12) United States Patent
Cooke (10) Patent No.: US 8,085,567 B2
(45) Date of Patent: *Dec. 27, 2011

(54) ITERATIVE SERIAL CONTENT ADDRESSABLE MEMORY

(76) Inventor: Laurence H. Cooke, Los Gatos, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 12/647,044

(22) Filed: Dec. 24, 2009

(65) Prior Publication Data

US 2010/0097831 A1    Apr. 22, 2010

Related U.S. Application Data

(63) Continuation-in-part of application No. 12/113,242, filed on May 1, 2008, now Pat. No. 7,649,759, which is a continuation of application No. 11/361,947, filed on Feb. 23, 2006, now Pat. No. 7,369,422.

(51) Int. Cl.
*G11C 15/00* (2006.01)

(52) U.S. Cl. .................................. 365/49.1; 365/49.17

(58) Field of Classification Search ............... 365/49.1, 365/49.17, 221; 711/108
See application file for complete search history.

(56) References Cited

U.S. PATENT DOCUMENTS

| | | | |
|---|---|---|---|
| 5,305,258 A | 4/1994 | Koshizuka et al. | |
| 5,808,929 A | 9/1998 | Sheikholeslami et al. | |
| 6,006,306 A | 12/1999 | Haywood et al. | |
| 6,256,216 B1 | 7/2001 | Lien et al. | |
| 6,389,579 B1 | 5/2002 | Phillips et al. | |
| 6,999,331 B2 | 2/2006 | Huang | |
| 2005/0044307 A1* | 2/2005 | Regev et al. | 711/108 |
| 2005/0135134 A1 | 6/2005 | Yen et al. | |
| 2007/0079058 A1* | 4/2007 | Yoon et al. | 711/108 |
| 2008/0162824 A1 | 7/2008 | Jalowiecki et al. | |

* cited by examiner

*Primary Examiner* — Vu Le
(74) *Attorney, Agent, or Firm* — Connolly Bove Lodge & Hutz LLP (57) ABSTRACT

A technique is presented for implementing a content addressable memory (CAM) function using traditional memory, where the input data is serially loaded into a serial CAM. Various additions, which allow for predicting the result of a serial CAM access coincident with the completion of serially inputting the data are also presented.

10 Claims, 15 Drawing Sheets

Prior Art

Figure 2b

Prior Art

ITERATIVE SERIAL CONTENT ADDRESSABLE MEMORY

CROSS-REFERENCE TO RELATED APPLICATIONS

This application is a continuation-in-part of U.S. application Ser. No. 12/113,242, filed May 1, 2008, which is a continuation of U.S. application Ser. No. 11/361,947, filed Feb. 23, 2006 (now U.S. Pat. No. 7,369,422, issued on May 6, 2008), both of which are hereby incorporated by reference in their entirety.

FIELD OF THE INVENTION

Embodiments of the present invention may generally pertain to serially addressing a traditional high density semiconductor memory core in a pipe-lined fashion to obtain the equivalent function of a content addressable memory with less logic in an iterative fashion

BACKGROUND OF THE INVENTION

Figure 1A:
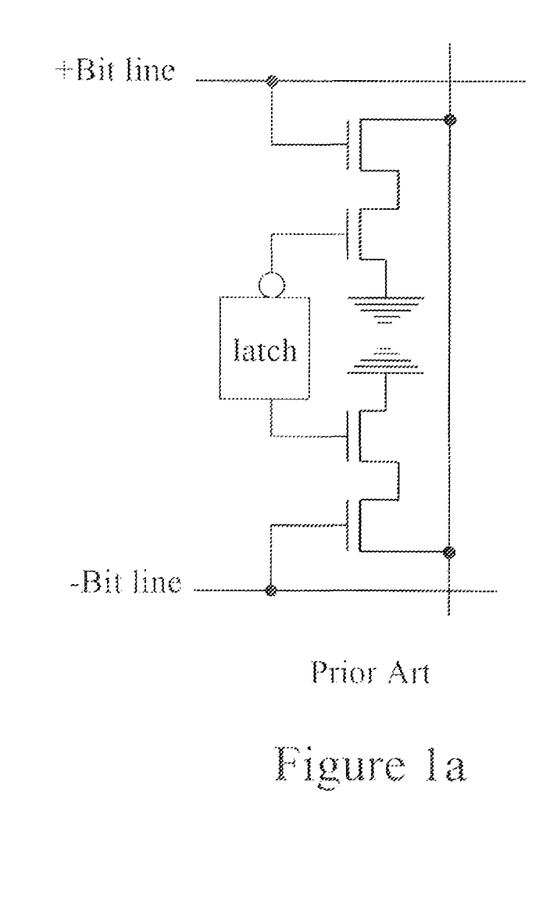
FIGS. 1a and 1b are diagrams of binary and ternary CAM bits.
Figure 1B:
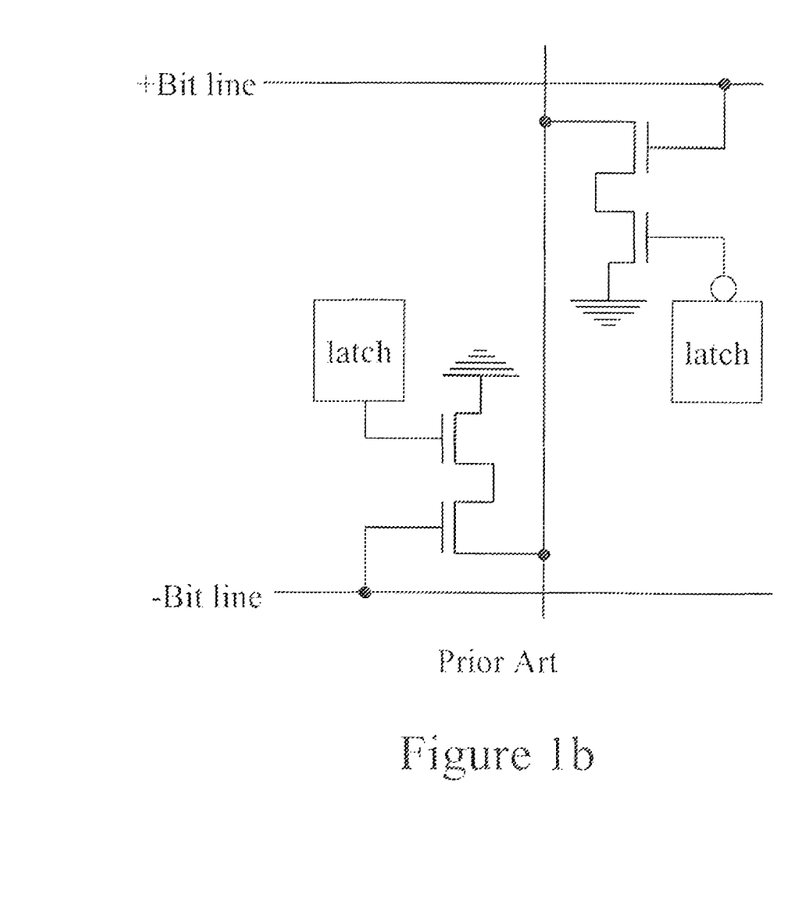

Numerous examples of content addressable memories (CAMs) exist including U.S. Pat. No. 6,999,331, granted Feb. 14, 2006 to Huang; U.S. Pat. No. 6,389,579, granted May 14, 2002 to Phillips et al.; and U.S. patent application Ser. No. 10/609,756, filed Jun. 20, 2003, by Yen et al. They all refer to a bit of memory as taking from 8 to 16 transistors depending if the content addressable memory is binary, as shown in FIG. 1a, or ternary, as shown in FIG. 1b, and while the demand for fast content addressable memory has grown with the need for address translation in digital communications, the size of the memory has limited the product offerings to under a megabit per chip, while DRAM is approaching a gigabit per chip. At the same time, communications has become increasingly serial. The primary communications input to routers and switches is high-speed serial digital streams of data, much of which is self-clocked. Traditionally the address portion of a packet of data is serially read into a chip by a SERDES, and loaded into a register. Thereafter the register's contents are transferred to the data inputs of the CAM, to get the port address for the transfer of subsequent data stream in the packet.

The latency of the switching operation is critical to the smooth operation of switches and routers, but as can be seen, the content addressable memory operation doesn't begin until after the entire address has been captured. This latency also increases as the number of chips to hold the content addressable data grows because the hits between multiple chips must be resolved before the port address can be determined. Therefore, the ability to economically hold greater amounts of content addressable data would also reduce the latency.

Figure 2A:
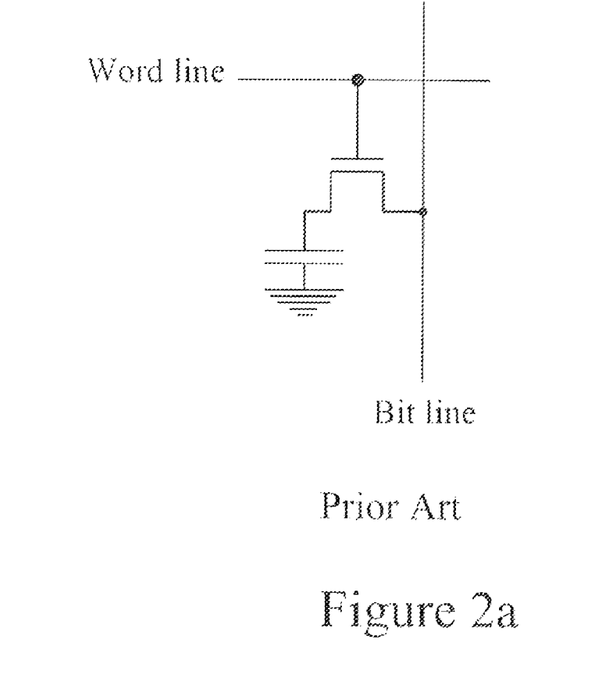
FIGS. 2a and 2b are diagrams of a DRAM bit and an SRAM bit.
Figure 2B:
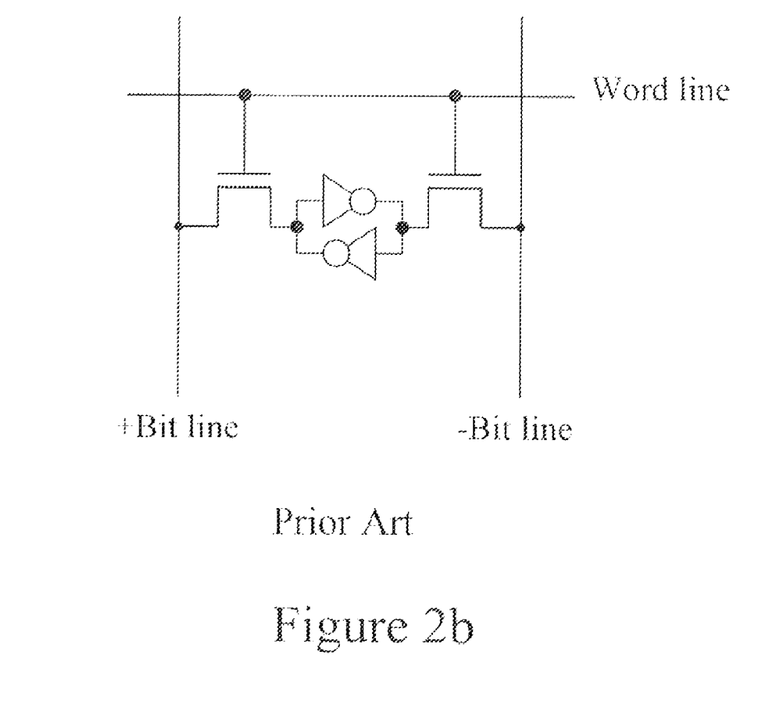

Dynamic random access memory (DRAM) structures are the densest volatile digital memory structures in semiconductor technology. Each bit requires only one transistor and a capacitor, as can be seen in FIG. 2a. Unfortunately, these memories are often quite slow. Alternatively there exists static random access memory (SRAM) structures that require 3 to 6 transistors per bit, as can be seen in FIG. 2b, but are much faster, and require less sense circuitry. Traditionally, both of these types of memories are organized with more word lines than bit lines, since all the bits in a word are accessed at the same time.

SUMMARY OF EMBODIMENTS OF THE INVENTION

This disclosure describes a way to serially access all the data within a high-density DRAM or SRAM digital memory in a pipelined fashion, for the purposes of translating the inputted data, based on its content, into an associated value. To accomplish this, the memory core may be organized with more bit lines than word lines, and the data in the memory may be transposed relative to a normal memory, such that each word line addresses one bit of all the words in the memory, hence we will refer to it as a bit line. Similarly, in a traditional memory the accessed word of data is outputted on the bit lines, but since the data is transposed in our memory, we will refer to these bit lines as data lines.

Using the new nomenclature, N bits of input data may be entered into the serial CAM in a serial fashion, one bit at a time. The CAM consists of M words of memory and M sets of comparison logic, one for each word of memory. As each input data hit enters the CAM, the corresponding bit in each word is accessed and available on that word's data line. The input data bit may then be simultaneously compared with its corresponding data bit from all the words in the memory. The results of these comparisons are stored such that at the end of N clock cycles only those words that match all the input data bits entered are still set. The resulting M bits may then be encoded and optionally translated into a port address, if one exists.

In this fashion, the CAM operation may still take only one memory access after all address bits are available, but the memory may be DRAM or SRAM, which is much denser than a traditional CAM and therefore more cost efficient.

The present disclosure presents both a Binary serial CAM and a mixed Binary/Ternary CAM logic, both of which work using the above technique.

In addition, since the addressing sequence may be the same for every CAM operation, pre-fetch of the data is possible, which can, in some cases, with the appropriate look-ahead logic, completely eliminate the delay from the acquisition of the last bit of input data to the output of an appropriate translated address.

This disclosure also describes Serial CAM logic that may be extended to iteratively compare the J bits of serial input data K times so as to compare the input data with all K-J bit segments residing in each of the M-N bit words in the memory, thereby increasing the amount of memory that may be compared by each word's CAM logic.

Finally, this disclosure describes extending the Serial CAM design to compare the input data simultaneously with the contents from a plurality of memory banks.

BRIEF DESCRIPTION OF THE DRAWINGS

The invention will now be described in connection with the attached drawings, in which.

DESCRIPTION OF VARIOUS EMBODIMENTS

Embodiments of the present invention are now described with reference to FIGS. 1-15, it being appreciated that the figures illustrate the subject matter and may not be to scale or to measure.

Figure 3:
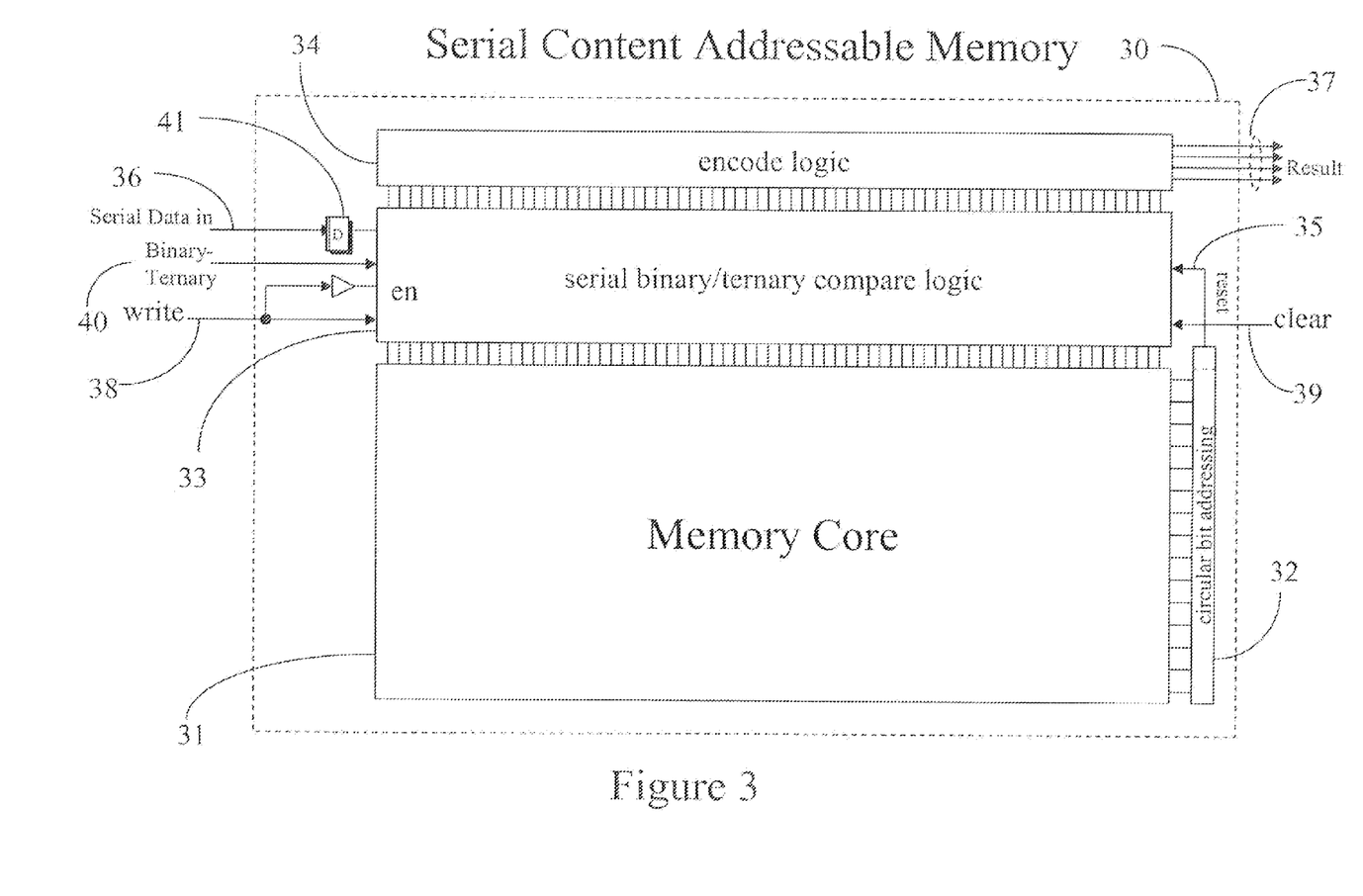
FIG. 3 is a diagram of an embodiment of a serial CAM.

A preferred embodiment of the present invention is a serial content addressable memory 30, consisting of a memory core 31, circular bit addressing logic 32, serial compare logic 33 and encode logic 34 as shown in FIG. 3. It is further contemplated that the memory core may be composed of either DRAM or SRAM cells. Each bit in the memory core 30 is successively addressed by clocking the circular hit addressing logic 32, which consists of a circular shift register comprised of N+1 bits with only one bit set. Each of N bits drives one of the bit lines to the memory core 31. The N+1 bit drives a reset signal 35, which clears the comparison bits to begin a new operation. To perform a content addressable memory operation, the input data is placed, one bit at a time, on the serial data in line 36, clocked into a single bit latch or flip-flop 41 when the content addressable memory is clocked. On the N+1 clock, after the N bits of input data have been entered, the results from the encode logic 34 are available on the result lines 37. To add data into the memory core, the write line 38 is set high, and N bits of input data are written into the next available word of memory, on successive clock cycles. One or more words of memory may be cleared by inputting an exact match of the word or words to be cleared and setting the clear line 38 high, which clears all the words that match the inputted data.

Figure 4:
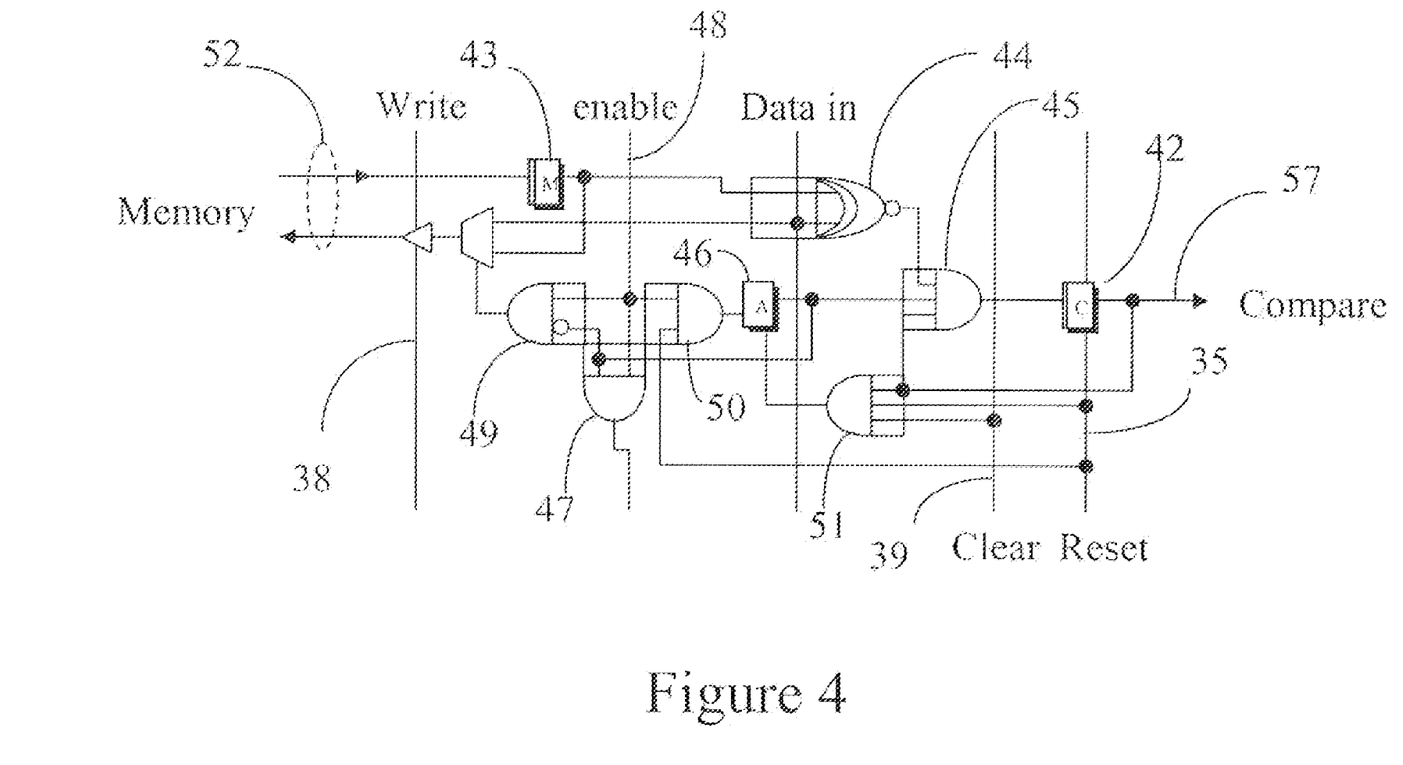
FIG. 4 is a diagram of one embodiment of the logic in each word of the serial CAM.

Reference is now made to FIG. 4, one embodiment of the compare logic associated with a single word of memory. Prior to loading the address, each compare latch or flip-flop 42 for all the words in memory is synchronously set to logic level 1 by the reset signal 35. At the beginning of the compare operation, when the memory is clocked, the first bit of data from the word in memory is captured in a latch or flip-flop 42. On the next clock cycle this data is compared with the data in value by an XNOR gate 44, and the results are gated by the state of the compare flip-flop 42 and the address flip-flop or latch 46, which is 1 if this word has contents to compare. On this and each successive clock cycle, the compare flip-flop 42 continues to capture a logic 1 level as long as the word has contents (the address flip-flop is set to a logic level 1) and the output of the data in flip-flop 42 is the same as the bit from the memory flip-flop 43. After comparing all N hits of the serial data in 36 with all the bits in the memory core 31 the compare flip-flops 42 that still have a logic level 1 signify a match.

When writing a new word into memory, the write signal 38 is set high, which drives the enable signal 48, for the first word high. The AND gate 47, gates the enable signal 48 low after passing the first unused word. The AND gate 49 selects the data from the memory flip-flop 43 for all other words except the first unused word, where the data from the data in flip-flop 41 is selected. The AND gate 50 ensures the address flip-flop 46 is set after writing the data into that word of memory, on the next cycle reset is set high.

Figure 5:
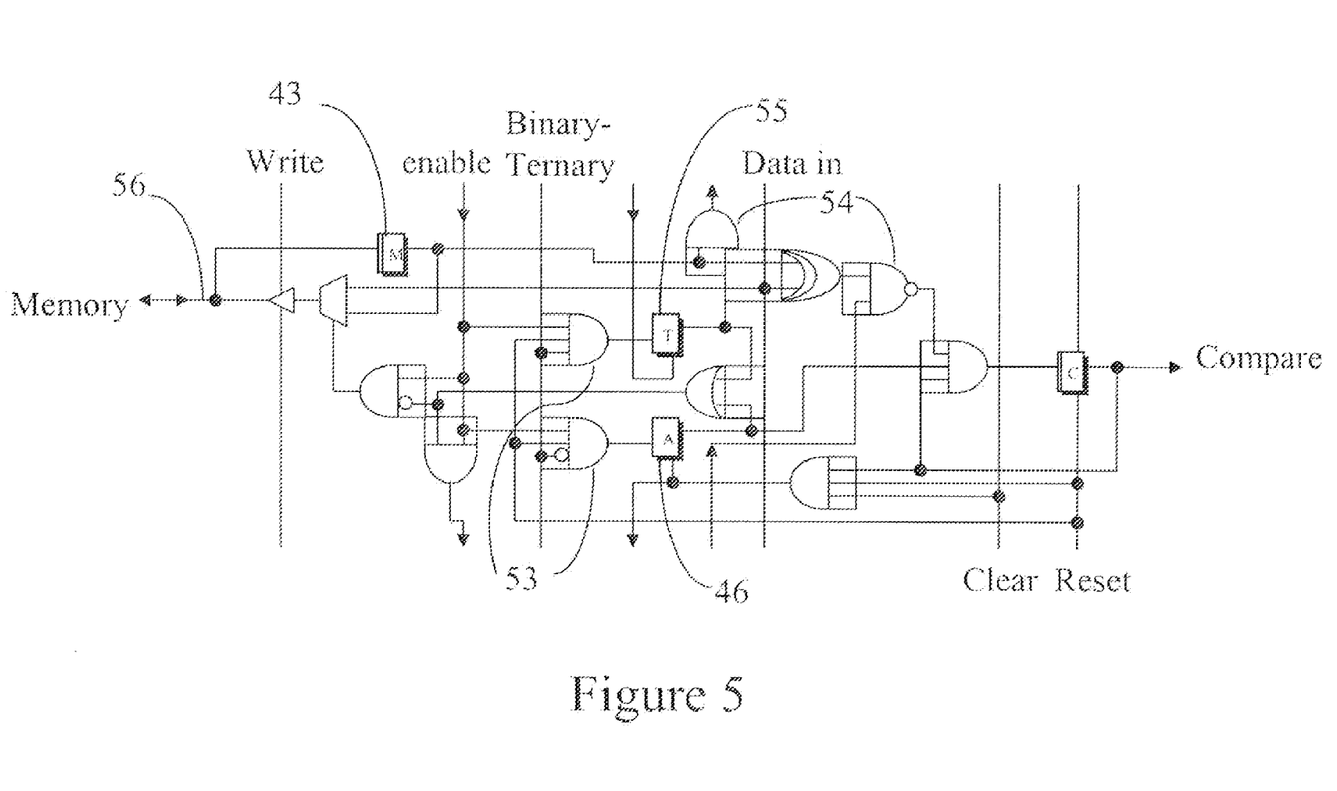
FIG. 5 is another embodiment of the logic in each word of the serial CAM.

To delete a word from memory, the clear signal 39 is set high on the same cycle reset is set high. The AND gate 51 clears the address flip-flop or latch 46 of the words whose compare signals 57 are still set high. The words that matched data inputted on the serial data in line 36 are cleared. It also should be noted that the memory may have separate lines for reading and writing 52, as shown here, or alternatively a single data line 56 for both reading and writing data to memory, as shown in FIG. 5.

As can be seen in FIG. 4 and the description above, this logic ensures loading, erasing and binary comparing of data within one clock cycle following the serial loading of input data.

Some CAMs have multiple bits per bit they compare. Three values are encoded in the two bits; zero, one and don't care. The "don't care" value always compares with the input data. This is traditionally called a Ternary CAM.

In another embodiment of the present invention, a variably mixed Binary/Ternary CAM is presented. Furthermore the number of binary entries in the memory and the number of ternary entries is solely a function of what is written into the memory, since any entry may be defined as binary and any pair of entries may be defined as ternary. In addition a binary entry may be converted into a ternary entry by adding its corresponding ternary data in the word following the binary entry.

Reference is now made to FIG. 5, another embodiment of the compare logic associated with a single word of memory. In this embodiment of the compare logic there exist two address flip-flops per word; one address flip-flop 46 identifies the existence of normal data, and one ternary flip-flop 55 identifies "don't care" ternary data. The logic 53 ensures only one of the two flip-flops 46 and 55 is set after writing a word of data into the memory. This is done during the reset cycle following a write operation by setting the Binary-Ternary signal 40 either high to signify normal data or low to signify ternary "don't care" data. In this embodiment a bit of "don't care" data is signified by a logic level 1 in a word whose ternary flip-flop 55 is set high. The ternary data is not compared with the values on the serial data in flip-flop 40, rather two additional gates 54 combine the values from the memory flip-flop 43 and the ternary flip-flop 55 and use it to select or ignore the bit compare of the previous word. In this way logic level 1s in a word of ternary data that follows a word of addressed data act as "don't care" bits when comparing the addressed data with the serial data in. When clearing words from memory, both the address flip-flop 46 of the compared word and the ternary flip-flop 55 of the next word are cleared. In this fashion any amount of binary or ternary data may be loaded into the memory 31, and varied as needed. Furthermore if the word following a word of binary data is unused or cleared, it may be loaded with ternary data, and subsequently all comparisons of the inputted data with the binary data from that word will use the following word as ternary "don't care" data in the comparison.

Figure 6A:
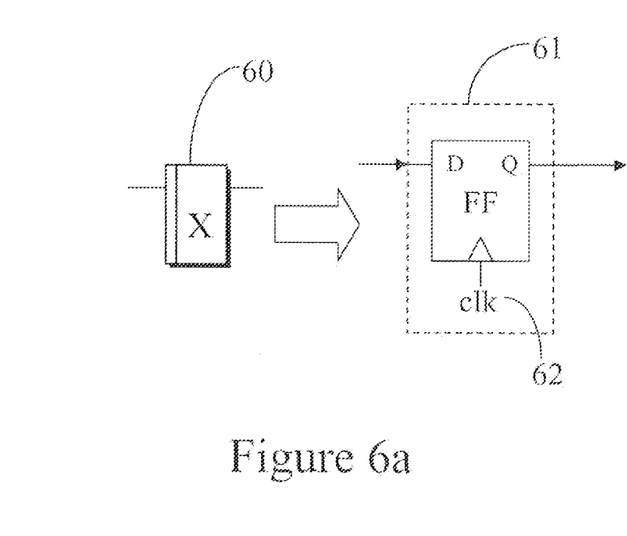
FIGS. 6a and 6b are diagrams of Flip-flops.

Reference is now made to FIG. 6a, a diagram of a Flip-flop. The symbol 60 is equivalent to the diagram 61. The clock 62 is implicit. This symbol is used for Flip-flops 42, 43 and 80 in FIGS. 3, 4, 5 and 8.

Figure 6B:
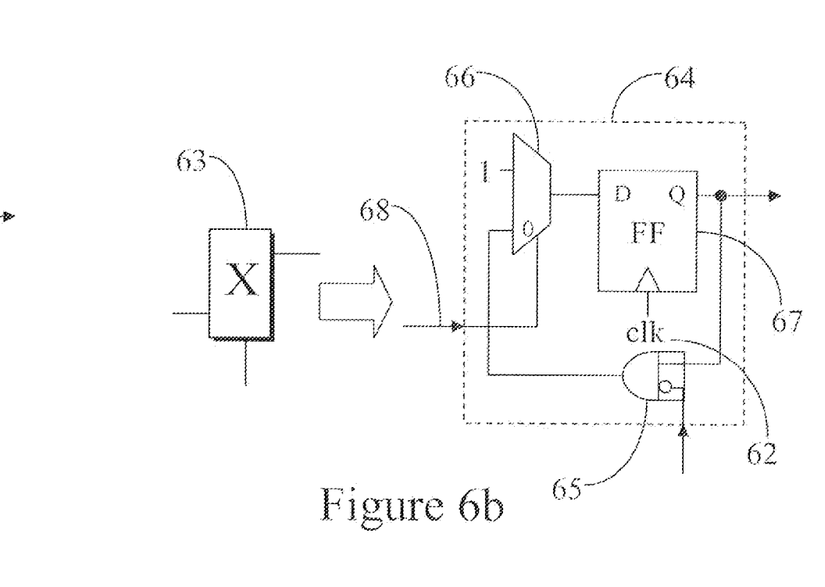

Reference is now made to FIG. 6b, another diagram of a Flip-flop. The symbol 63 is equivalent to the diagram 64, which includes a NAND gate 65 to synchronously clear the Flip-flop 67, a multiplexor 66, which either synchronously loads a 1 into the Flip-flop 67 when the select input 68 is 1 or re-circulates the data in the Flip-flop when the select input 68 is 0. This symbol is used for Flip-flops 46 and 55 in FIGS. 4, 5 and 8, and Flip-flops 121 and 123 in FIG. 12.

Figure 7A:
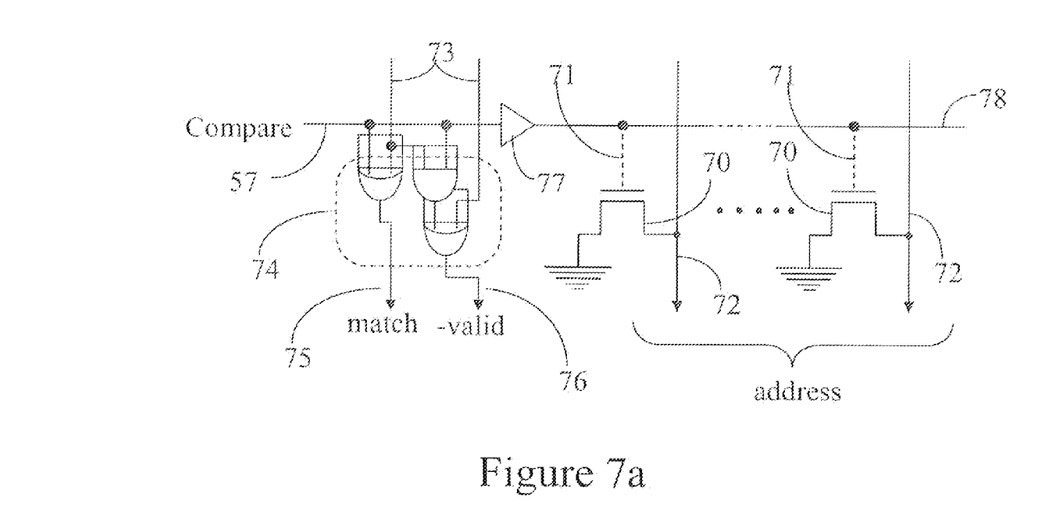
FIGS. 7a and 7b are diagrams of encode logic.

Reference is now made to FIG. 7a, a diagram of an embodiment of the encode logic for a single word. The data lines 72 are typically pre-charged to a high level such that when a compare occurs, the transistors connected to the buffered compare line 78 pull their data lines 72 low, to output the address of the matching word. The inputs 73 to the control logic 74 are tied to ground before the first word. The match line 75 is set high when one or more compare lines 57 are high, and the valid line 76 is set high when two or more compare lines 57 are high. The data lines 72 and control lines 75 and 76 form the set of result lines 37 shown in FIG. 3.

It is further contemplated that different control logic may gate the compare line 57 at the buffer 77 to select just the first compare line that is high, and reset the compare flip-flops of selected words on successive cycles until valid is low.

Figure 7B:
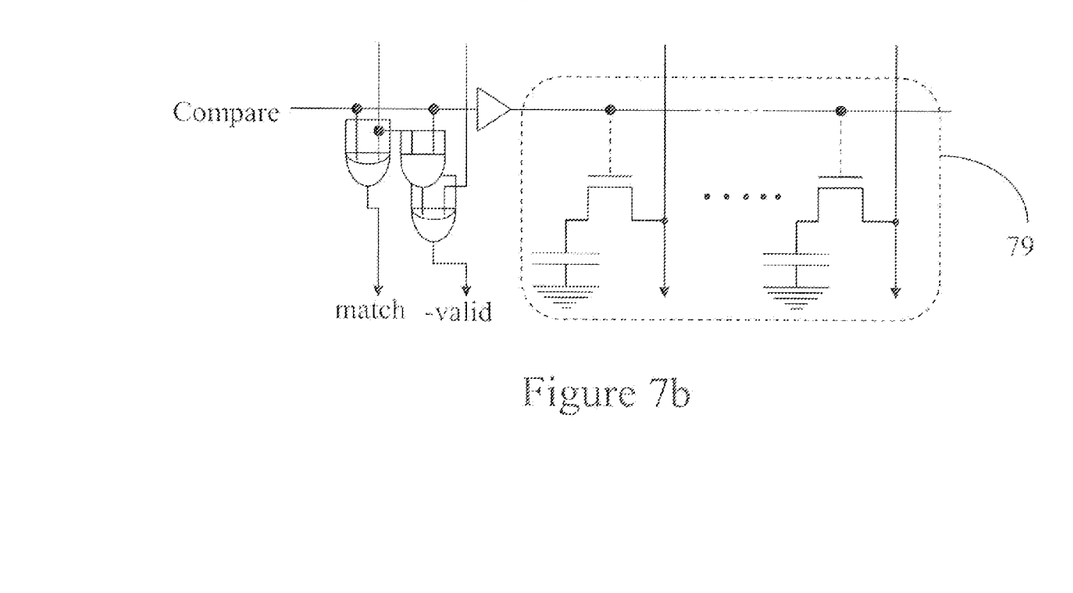

Reference is now made to FIG. 7b, another diagram of encode logic for a word of memory. Alternatively the compare line 57 may select a word of memory 79, which may also be loaded following the loading of the corresponding word of the memory core 31 in FIG. 3.

In another embodiment of the present invention, look ahead may be employed in the comparison process to occasionally finish the comparison prior to comparing the last serial data in bits with their corresponding bits of memory.

Figure 8:
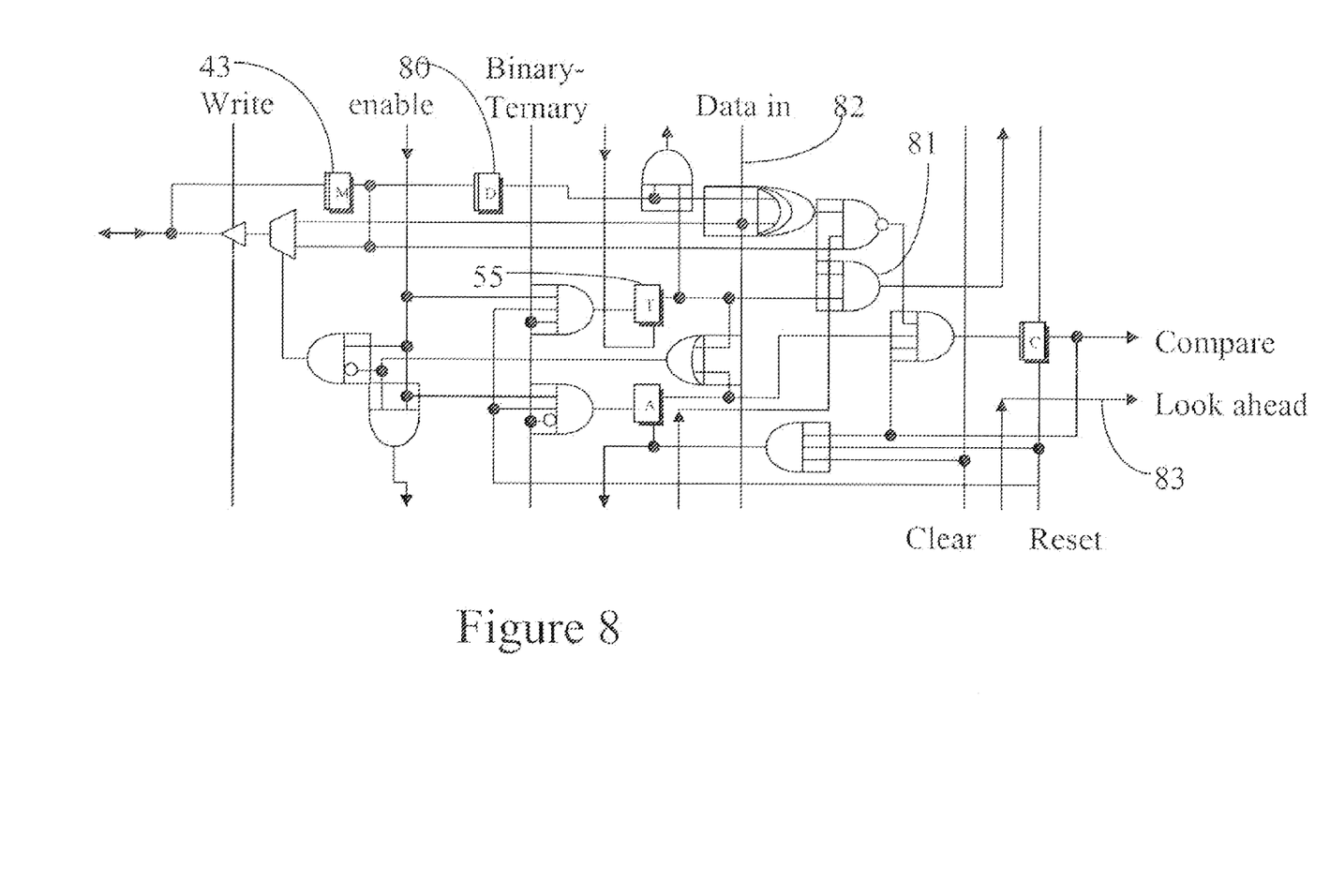
FIG. 8 is another embodiment of the logic in each word of the serial CAM.

Reference is made to FIG. 8, another embodiment of the compare logic for each word of the serial CAM. In this case there is an additional flip-flop stage 80, such that at least one clock cycle ahead of the first serial data in value, the first bit of every word of memory is loaded into the memory flip-flop 43. On the next clock, the first hit of serial data in is compared with the first hit of memory data that is transferred to the additional flip-flop 80. At the same time the next bit of data is available in the memory flip-flop 43. The value in the memory flip-flop 43 is gated 81 with the ternary flip-flop's value and set on the look-ahead line 83 for the previous word. The look-ahead line is only set when the next bit is a ternary "don't care".

Figure 9:
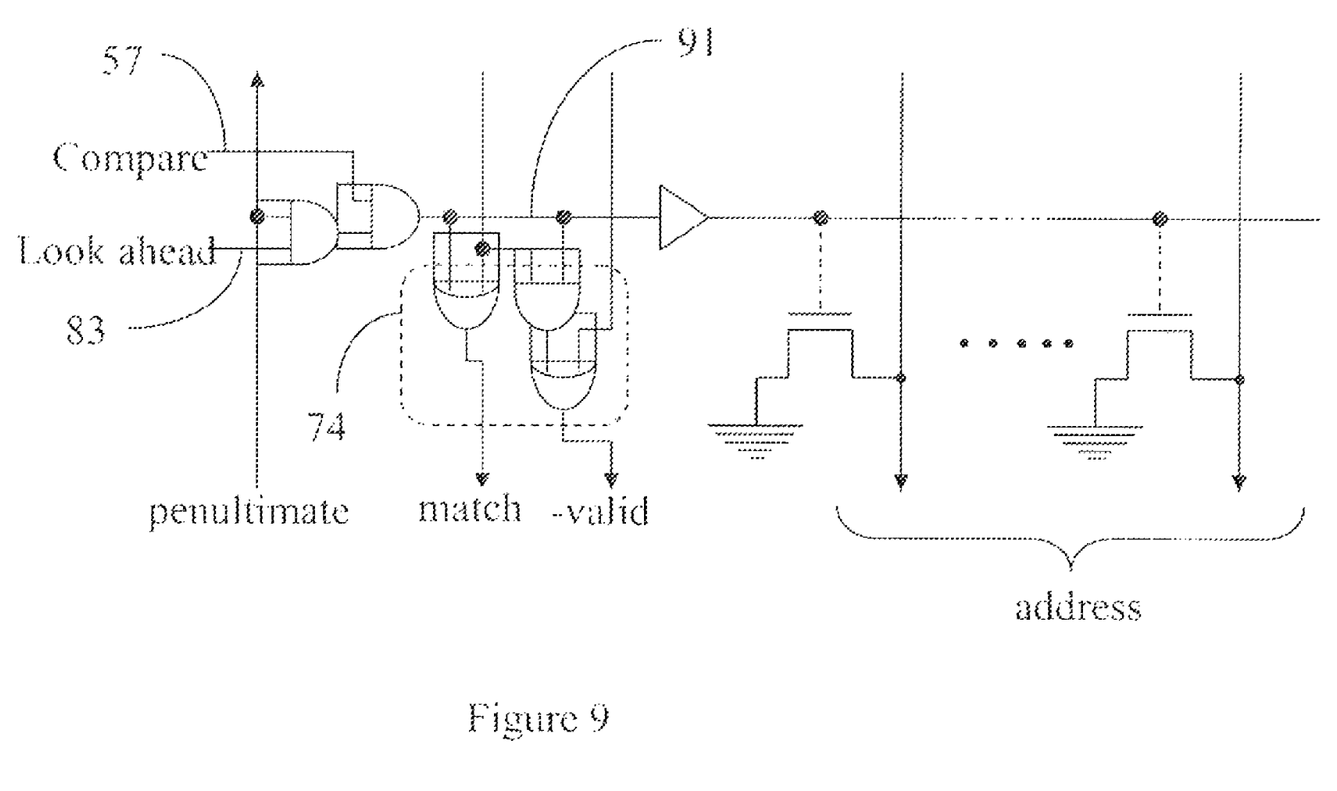
FIG. 9 is another diagram of encode logic with look-ahead.

Reference is now made to FIG. 9, another diagram of encode logic, but with look-ahead logic. In this example the look-ahead line 83 is gated with a global penultimate line 90 that is obtained from the circular bit addressing logic 32 in FIG. 3, in a manner similar to the reset line 35, in FIG. 3, and is further gated with the compare line 57. The resulting compare 91 drives the control logic 64. This has the effect of limiting the compares to those words that compare up to the last bit and will compare on the last bit because it is a "don't care". If a match occurs on this next to last cycle, the results may be captured on the same clock that is capturing the last serial data in bit into the flip-flop 40 in FIG. 3, which is equivalent to zero latency between the serial data in and the results out.

In yet another embodiment of the present invention, the memory core may have orthogonal read and write operations, which allows for parallel loading of the CAM data, while continuing with serial reading of the data. This is desirable since in most systems the data being loaded into the memory is obtained, generated and stored in parallel form, whereas most of the data being used in the CAM access, to obtain translated results, is transferred to the CAM serially.

Figure 10:
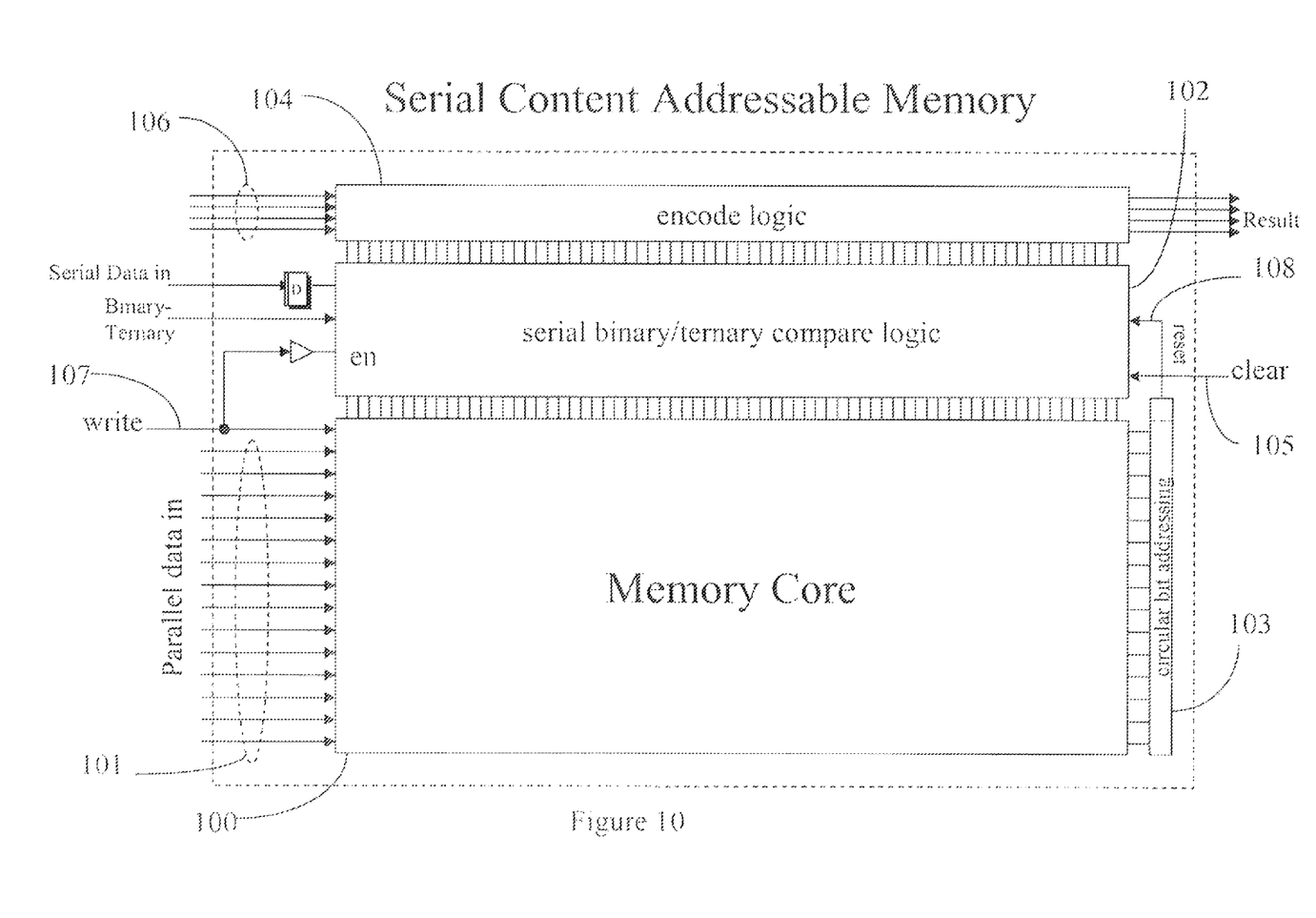
FIG. 10 is a diagram of a serial CAM with parallel write capability.

Reference is now made to FIG. 10, a diagram of a serial CAM with parallel write capability. In this embodiment, the memory core 100 includes a parallel data in port 101 for writing data into the memory. The address lines for writing the parallel data into the memory are perpendicular to the parallel data in lines and originate in the compare logic module 102. The bit address lines originate in the circular bit addressing logic 103, and select the bit to be read into the compare logic module 102 for each word.

Figure 11:
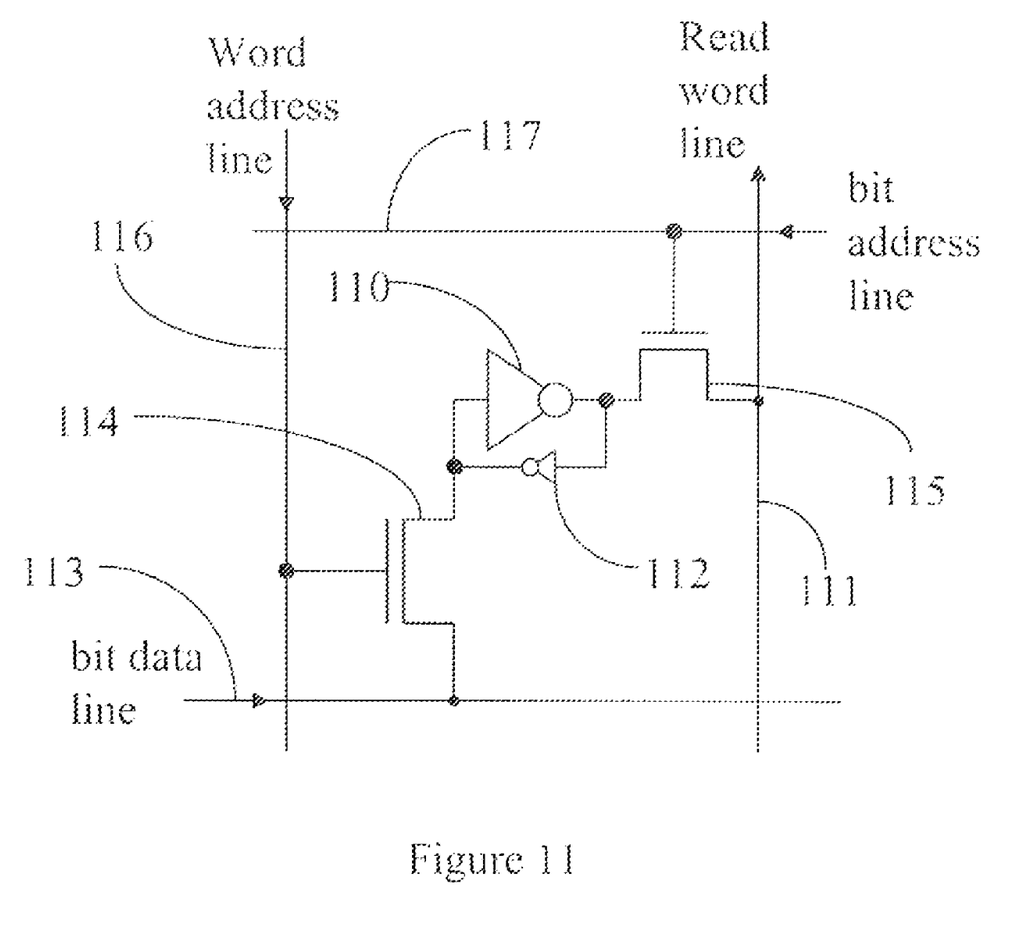
FIG. 11 is a diagram of an SRAM bit for a serial CAM with parallel write capability.

Reference is now made to FIG. 11, a diagram of an SRAM bit for a serial CAM with parallel write capability. It is relatively common in a two port SRAM to make the inverter 110, which drives the read word line 111 larger than the inverter 112, which must be over driven by the bit data line 113, but in this case since the word lines are relatively short compared to the number of words, the optimal ratio may be larger than a normal SRAM. Similarly, it is relatively common to have a larger N channel transistor 114 for writing than the N channel transistor 115 for reading, but in this case the optimal ratio will also have to be adjusted for the different configuration of the memory, since the capacitance of the word address line 116 is less important than the bit address line 117 capacitance in this configuration. What is unusual is the orthogonal nature of the read versus write.

Figure 12:
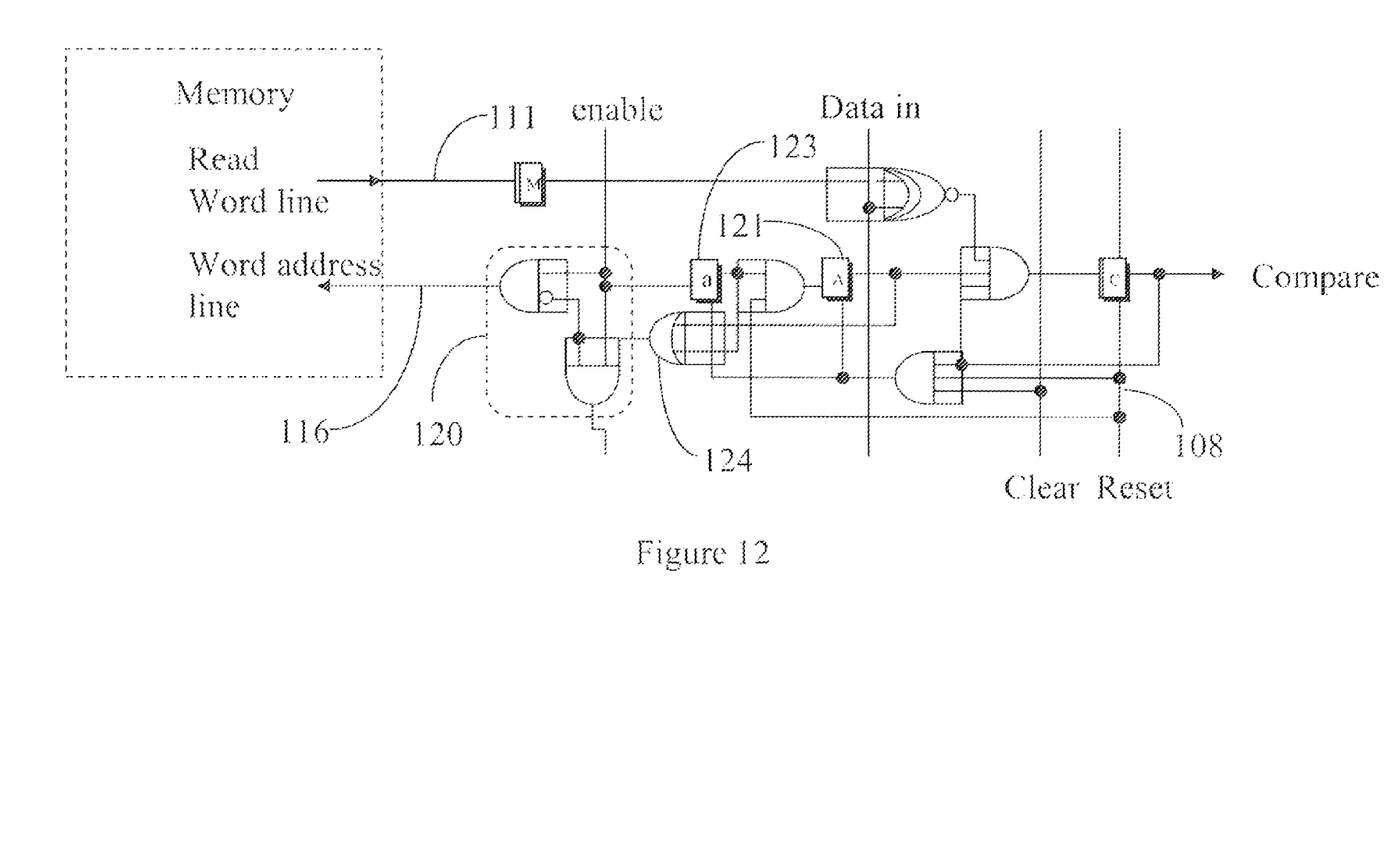
FIG. 12 is a diagram of compare logic for the serial CAM in FIG. 10.

Reference is now made to FIG. 12, a diagram of compare logic for the serial CAM in FIG. 10. Just as in the previous versions of the compare logic, the read word line 111 from the memory drives a memory flip-flop 124, but in this case the enable logic 120 drives the word address line 116 directly, selecting the first available word address to write into, regardless of whether a comparison is currently being done. The address flip-flop 121 is enabled only after the reset line 108 is set high, but during each write the alternate address flip-flop 123 is enabled to be loaded with a 1. Both the address flip-flop 121 and the alternate address flip-flop 123 control the next word's enable signal through an OR gate 124. As a result multiple writes can occur simultaneously with the serial read of the CAM, but the new data will only be activated at the beginning of the next CAM access.

One copy of the compare logic shown in FIG. 12 may be connected to each word of memory. Currently, typical CAM words are as much as 80 to 128 bits wide but the number of words in a CAM may be many orders of magnitude larger, which would require considerable logic for the compare function, compared to a memory with fewer, much larger words. So, in yet another embodiment of the present invention each N bit word may be divided into K segments of J bits each, where K*J=N, and the comparison logic may be modified to compare all segments in M words to K repeating copies of the J bit input data.

Figure 13:
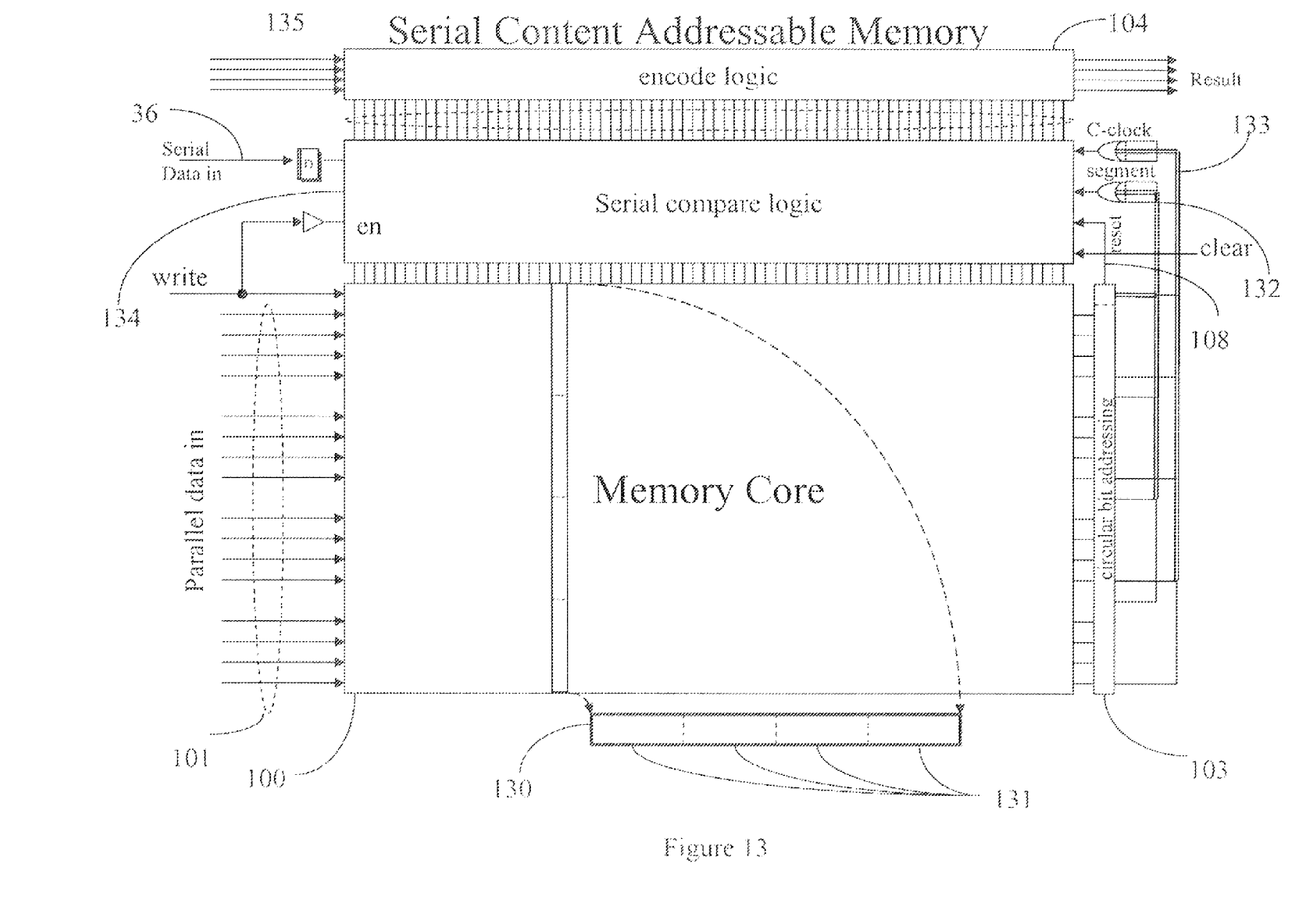
FIG. 13 is a diagram of the serial CAM in FIG. 10 with logic for words segmented into K-N bit segments per word, according to an embodiment of the invention.

Reference is now made to FIG. 13, a copy of FIG. 10 augmented to manage K segments of J bits in each of the N bit words. Each word 130, in the memory 100 may be logically divided into K segments 131, where each are J bits in size. The compare logic 134 has been modified to include a C-clock 133, which clocks on reset and on the last bit of each segment, and a segment signal, which goes high on reset and between each segment. Both the segment signal and the C-clock may be driven by the circular hit addressing logic 103, which has an additional cycle between addressing each segment for setting the segment signal high. All segment values, within a given word, may be written in the same clock cycle through the Parallel data in lines 101, and each bit, across all segments in a word, may be compared to the corresponding bit in the N bits of input data serially inputted into the Serial Data in 36.

Figure 14:
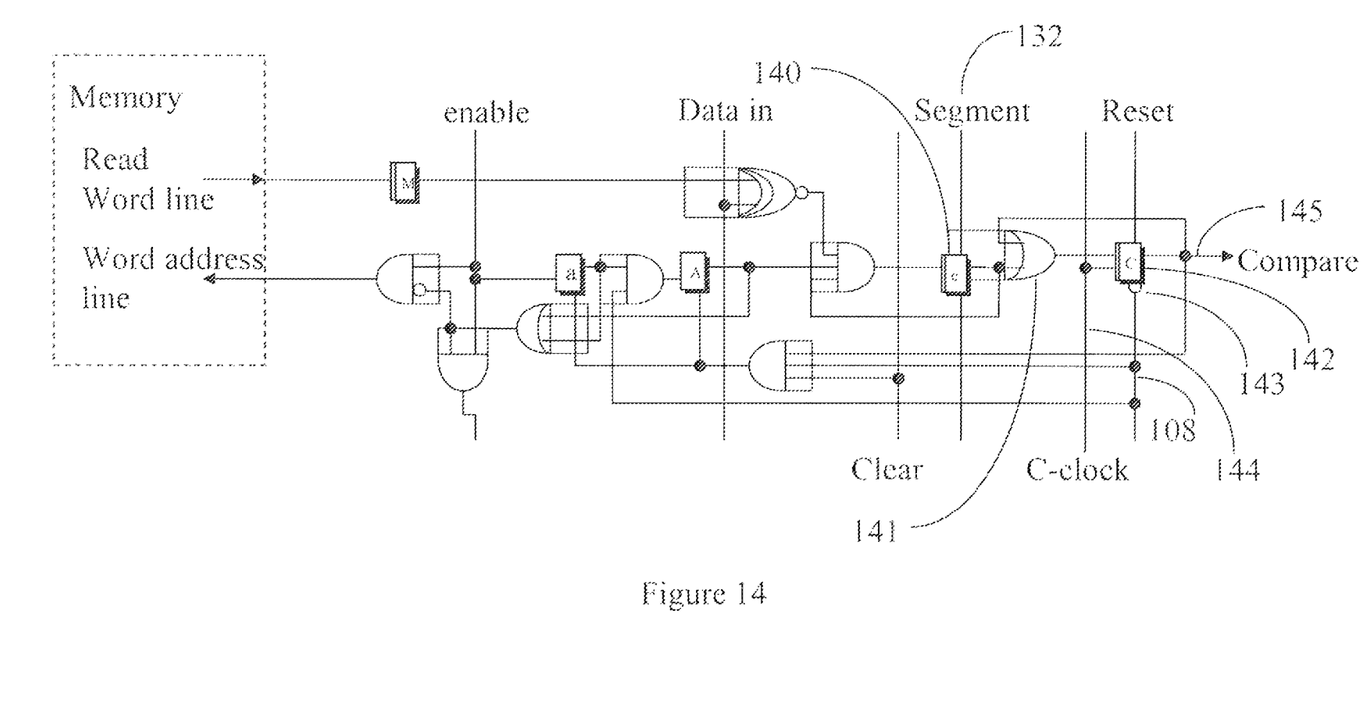
FIG. 14 is a diagram of the compare logic for the serial CAM in FIG. 13, according to an embodiment of the invention.

Reference is now made to FIG. 14, a diagram of the compare logic for the serial CAM in FIG. 13. In this case, compare flip-flop 140 may be set to a logic level 1 by the segment signal 132, prior to comparing the first bit in each segment. As with the prior compare flip-flop, it maintains a logic level 1 as long as the next J input bits compare with the corresponding J bits from memory. In this case, there may also be a compare flip-flop 142, which may be set to a logic level 0 by the reset signal 108, as signified by the inverter symbol 143. This compare flip-flop 142 may be clocked by the C-clock signal 144 at reset and on comparison of the last bit of each segment, such that the result of each segment's comparison may be combined with and replace the contents of the compare flip-flop 142 by the OR gate 141. In this fashion, the compare signal 145 remains a logic level 0 only if all of the J bit segments in the word do not compare with their corresponding J serial data input bits.

Furthermore, the N bits of serial input data need not contain the same J bits repeated K times. In other words, K distinctly different J-bit values may be compared with the corresponding K segments in each word of the serial CAM.

Ideally, to minimize the size of the size of the serial CAM, the word or line size may be designed to be as large as possible, but larger the word size, the more time or clock cycles may be required to complete a comparison, because the comparison time increases with the number of bits in a word or line. In yet another embodiment of this invention, multiple banks of memory may be compared in parallel, and written in parallel, allowing the common use of the addressing logic and thus reducing the comparison logic per bank, while keeping the comparison time to the word size of each bank.

Figure 15:
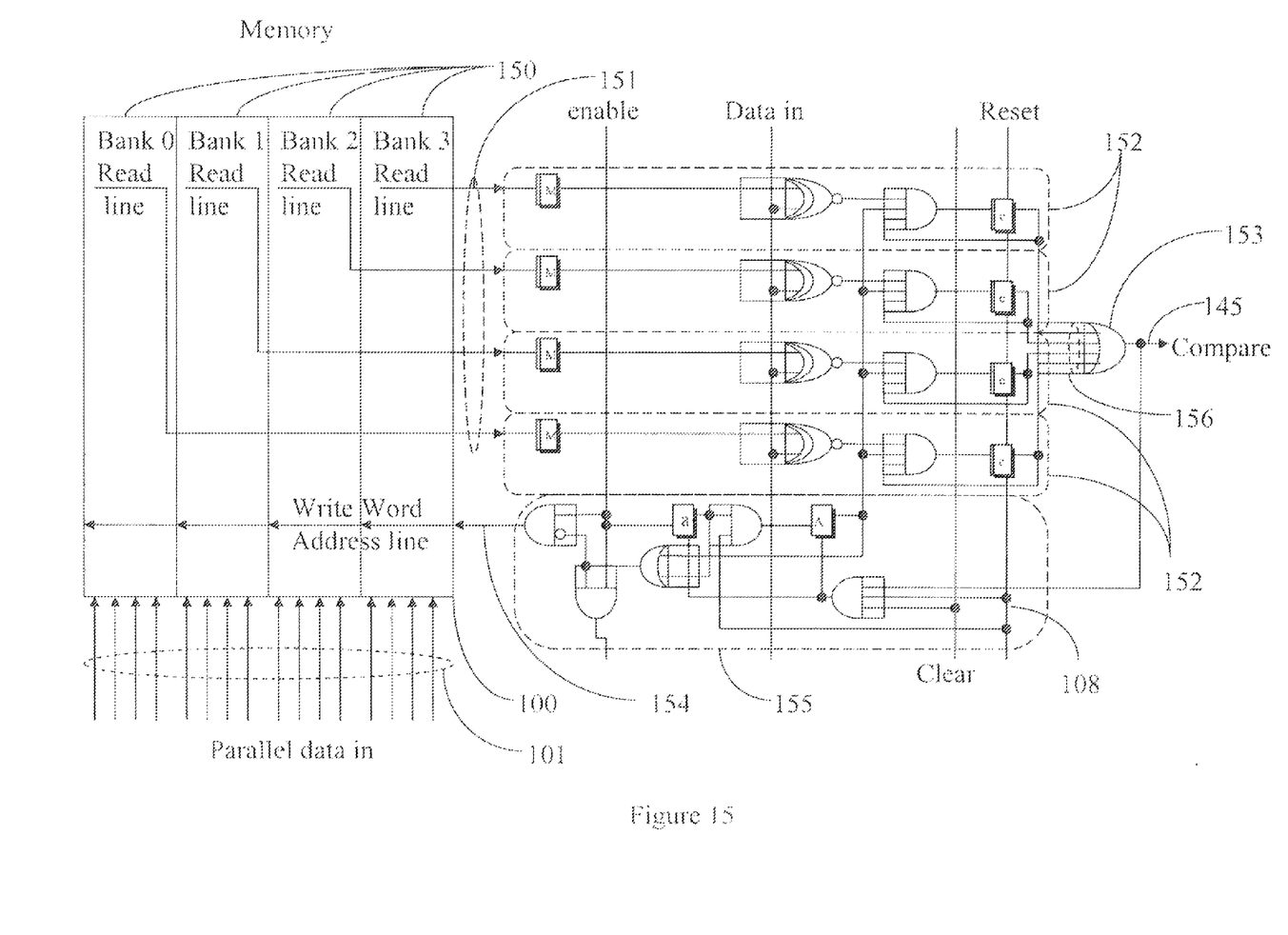
FIG. 15 is a diagram of the compare logic for a serial CAM with four parallel memory banks, according to an embodiment of the invention.

Reference is now made to FIG. 15, a diagram of the compare logic for a serial CAM with four parallel memory banks. The memory 100 contains four banks 150, each with separate read data lines 151 for each of their words, and one common write word address line 154 such that the parallel data in 101 is 4 times larger than the word data read out of each bank. This design may compare words from all four memory banks to the serial data in using the comparison logic 152. If the contents of any of the banks compare to the serial data in at least one of the compare signals 156 output from the comparison, logic 152 will remain at a logic level 1. Thus the compare signal 145, which is the result of the OR 153, will also remain at a logic level 1. One skilled in the art can see that less logic is required for this implementation than the embodiment in FIG. 12, because the address logic 155 simultaneously addresses the same word in all four memory banks, thereby eliminating the need for multiple copies of address logic.

It is further contemplated that individual compare signals 156 may be outputted from each of the copies of the comparison logic 153, directly into the enable logic, with the OR 153 of the signals only used to enable the write address line. It is also contemplated that the OR gate 153 may be any logic function. For example, an AND would require all four banks to match to select the enable logic. It is contemplated that other parallel operations may be included in other versions of the serial CAM such as parallel write of the encode memory, if it exists, through data inputs 116 as shown in FIG. 10, or parallel operations to load binary and ternary data by combining the features of the compare logic in FIG. 8 with the features of the compare logic in FIG. 12. It is also contemplated that other look-ahead functions may be similarly generated, such as including a last bit value and presenting the results if the selected words in a memory such as shown in FIG. 7 contain the same value. It is further contemplated that standard forms of addressing, or serial addressing may be used to load and clear the memory cores 31 and any memory that exists in the encode 34 shown in FIG. 3, or in the memory 100 and encode 104 shown in FIG. 10. Furthermore it is contemplated that different combinations of logic, some of which employ fewer transistors, may be employed in producing the functions or functions similar to the functions described in the compare 33 and the encode logic 34 in FIG. 3, or in the compare logic 102 and the encode logic 104 in FIG. 10. Lastly it is contemplated that various forms of non-volatile memory such as ROM, and PROM may be used in place of the DRAM or SRAM in the memory core 31 and encode 34 in FIG. 3, or memory core 100 and encode 104 in FIG. 10.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

I claim:

1. A method for performing a serial content addressable memory read using a content addressable memory including the steps of:
   serially loading input data into said content addressable memory through a single data input;
   for each word in a standard memory, comparing each bit of said input data with the corresponding bit of said word;
   for each said word, setting a compare line of said encode logic with the logical AND of said comparing; and
   outputting results from said encode logic.

2. A content addressable memory including:
   a single data input configured for serially loading input data;
   a plurality of memory banks;
   compare logic for respective words of said memory banks;
   common address logic for respective words of all said memory banks; and
   encode logic;
   wherein said common address logic is configured to simultaneously address all of said memory banks.

3. A content addressable memory as in claim 2, further including: a plurality of parallel data bit inputs;
   wherein each of said parallel data bit inputs is configured to be written into a corresponding bit of an addressed word of one of said memory banks.

4. A content addressable memory as in claim 2, wherein each word of said encode logic is selected by a function the compare logic outputs.

5. A content addressable memory as in claim 4, wherein said function is an OR of the compare logic outputs.

6. A content addressable memory as in claim 4, wherein said function is an AND of the compare logic outputs.

7. A content addressable memory including:
   a single data input;
   a memory;
   compare logic for a word of said memory; and
   encode logic;
   wherein each word of said memory includes a plurality of segments, and
   wherein the compare logic is configured to serially compare each bit of each segment to a corresponding, input data bit inputted into said single data input.

8. A content addressable memory as in claim 7, wherein said input data includes at least one value repeated for each of said plurality of segments.

9. A content addressable memory as in claim 7, wherein said input data includes a plurality of values corresponding to said plurality of segments.

10. A content addressable memory as in claim 7 further including: a plurality of parallel data bit inputs;
    wherein each of said parallel data bit inputs is configured to be written into a corresponding bit of one of said plurality of segments within an addressed word of said memory.

* * * * *